United States Patent
Splitthoff et al.

(10) Patent No.: US 11,187,769 B2
(45) Date of Patent: Nov. 30, 2021

(54) COMPUTER IMPLEMENTED METHOD AND SYSTEM FOR MAGNETIC RESONANCE IMAGING

(71) Applicants: Siemens Healthcare GmbH, Erlangen (DE); The General Hospital Corporation, Boston, MA (US)

(72) Inventors: Daniel Nicolas Splitthoff, Uttenreuth (DE); Julian Hossbach, Erlangen (DE); Josef Pfeuffer, Kunreuth (DE); Stephen Farman Cauley, Somerville, MA (US); Melissa Haskell, Cambridge, MA (US)

(73) Assignees: THE GENERAL HOSPITAL CORPORATION, Boston, MA (US); SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 16/851,624

(22) Filed: Apr. 17, 2020

(65) Prior Publication Data
US 2020/0341101 A1     Oct. 29, 2020

Related U.S. Application Data

(60) Provisional application No. 62/839,013, filed on Apr. 26, 2019.

(51) Int. Cl.
*G01R 33/565*     (2006.01)
*G01R 33/48*     (2006.01)
*G01R 33/56*     (2006.01)

(52) U.S. Cl.
CPC ... *G01R 33/56509* (2013.01); *G01R 33/4818* (2013.01); *G01R 33/5608* (2013.01)

(58) Field of Classification Search
CPC .......... G01R 33/56509; G01R 33/4818; G01R 33/5608
See application file for complete search history.

(56) References Cited

U.S. PATENT DOCUMENTS

| 5,382,902 A | 1/1995 | Taniguchi |
| 2002/0095085 A1* | 7/2002 | Saranathan ............ A61B 5/055 600/413 |
| 2016/0199004 A1 | 7/2016 | Meyer |

OTHER PUBLICATIONS

Haskell, Melissa W., et al., "TArgeted Motion Estimation and Reduction (TAMER): data consistency based motion mitigation for MRI using a reduced model joint optimization," IEEE transactions on medical imaging 37.5 (2018): 1253-1265.

(Continued)

*Primary Examiner* — G. M. A Hyder
(74) *Attorney, Agent, or Firm* — Lempia Summerfield Katz LLC

(57) ABSTRACT

The disclosure relates to a computer implemented method for magnetic resonance imaging. The method includes: receiving at least a first and a second subset of k-space data as radio frequency signals emitted from excited hydrogen atoms of a subject; sampling the first and second subset of k-space data; choosing the first subset of k-space data as a base subset of k-space data; estimating motion parameters of the second subset of k-space data against the base subset of k-space data; and correcting the second subset of k-space data based on the estimated motion parameters of the second subset of k-space data. The motion parameters of the second subset of k-space data are parameters of a non-linear motion estimating function representing a motion of the subject between receiving the first subset of k-space data and receiving the second subset of k-space data.

18 Claims, 3 Drawing Sheets

(56) References Cited

OTHER PUBLICATIONS

J. Hossbach et al. "Neural Networks for motion detection in k-space: applications and design", 2019, pp. 1-2. https://submissions.mirasmart.com/ISMRM2019/ViewSubmission.aspx?sbmID=990.

Loktyushin A, et al., "Blind multirigid retrospective motion correction of MR images," Magn Reson Med. 2015. 73(4):1457-1468.

Zaitsev, Maxim, et al., "Motion artifacts in MRI: A complex problem with many partial solutions," Journal of Magnetic Resonance Imaging 42.4 (2015): 887-901.

Loktyushin A, "Blind Retrospective Motion Correction of MR images," Dissertation, University of Tubingen, (2015): 1-164.

Atkinson, David. "Motion correction." Montreal Sunrise Course: Image Reconstruction, ISMRM vol. 19 (2011). pp. 1-9.

European Search Report for European Application No. 19180866.6-1010 dated May 20, 2020.

Johnson, P. M., and M. Drangova. "Motion correction in MRI using deep learning." Proceedings of the ISMRM Scientific Meeting & Exhibition, Paris. vol. 4098. 2018. pp. 1-4.

Zhang, Jialong, et al. "Protecting intellectual property of deep neural networks with watermarking." Proceedings of the 2018 on Asia Conference on Computer and Communications Security. 2018.. pp. 159-171.

\* cited by examiner

COMPUTER IMPLEMENTED METHOD AND SYSTEM FOR MAGNETIC RESONANCE IMAGING

The present patent document claims the benefit of U.S. Provisional Patent Application No. 62/839,013, filed Apr. 26, 2019, which is hereby incorporated by reference.

TECHNICAL FIELD

The disclosure relates to computer implemented methods, a system, a computer program, and a computer-readable medium for magnetic resonance imaging.

BACKGROUND

Motions during the acquisition of images or pictures generated from magnetic resonance imaging may result in image artifacts. This lowers the image quality and may lead to misinterpretation by physicians or a useless image. An expensive reacquisition of the whole scan may be undesired, but necessary.

For generating a final image of organs in the body, a so-called k-space is provided which is the two-dimensional (2D) or three-dimensional (3D) Fourier transform of the magnetic resonance (MR) image measured. The complex values of a k-space are sampled during an MR measurement in a premeditated scheme controlled by a pulse sequence, e.g., an accurately timed sequence of radiofrequency and gradient pulses. In practice, k-space may refer to the temporary image space, (e.g., a matrix), in which data from digitized MR signals are stored during data acquisition. When the k-space sampling is complete (at the end of the scan), the data are mathematically processed to produce a final image. Thus, a k-space holds raw data before reconstruction.

The acquisition of the raw frequency domain (k-space) values is thus done sequentially. Depending on the imaging settings, the time between the acquisition of different parts of the k-space may be long enough for motions to arise. This causes artifacts because motions alter the object orientation and position within the static Field of View (FOV), and thus the different k-space parts are not aligned to each other. In a simplified rigid model (not considering MR effects), the different k-space parts shift in their phase, if translational motions occurred between the measurements, and/or rotate, if rotational motions occurred. During reconstruction, these inconsistencies between the acquisition data segments are spread across the whole image domain, leading to image artifacts.

This problem regarding motions has been tackled in different ways so far. The article titled "Motion artifacts in MRI: A complex problem with many partial solutions," by Zaitsev M. et al., discloses inter alia a solution that by faster imaging, the amount and degree of motions that distort the final images may be reduced. However, this speedup may come at the cost of other issues such as limited spatial resolution. Special trajectories, such as spiral or radial sampling, may be more motion insensitive than Cartesian sampling. Prospective motion correction, (e.g., correction during the acquisition), may be achieved by using navigators during the acquisition in order to track motions. Alternatively, the k-space may be sampled redundantly in order to average out the motion effects. Another approach is carried out by using markers and an external tracking system.

The article titled "TArgeted Motion Estimation and Reduction (TAMER): Data Consistency Based Motion Mitigation for MRI Using a Reduced Model Joint Optimization," by Melissa W. Haskell et al., proposes a solution as an optimization problem by jointly estimating the motion parameters and optimized image. This, however, has a slow convergence speed and may be accelerated with an initial motion guess.

SUMMARY AND DESCRIPTION

Accordingly, it is an object of the present disclosure to improve the above-mentioned approaches in order to provide an improved solution for magnetic resonance imaging which is at least economically attractive, possible for any further usages, easy and fast to implement.

The scope of the present disclosure is defined solely by the appended claims and is not affected to any degree by the statements within this summary. The present embodiments may obviate one or more of the drawbacks or limitations in the related art.

The disclosure provides, according to a first aspect, a computer implemented method for magnetic resonance imaging. The method includes: receiving at least a first and a second subset of k-space data as radio frequency signals emitted from excited hydrogen atoms of a subject; sampling the first and second subset of k-space data; choosing the first subset of k-space data (or a group of subsets of k-space data with same orientation, e.g., the sum of relative motions among these subsets of k-space data is zero) as a base subset of k-space data (a group of subsets of k-space data forming the base are still referred to as base subsets of k-space data); estimating motion parameters of the second subset of k-space data against the base subset of k-space data; and correcting the second subset of k-space data based on the estimated motion parameters of the second subset of k-space data. The estimation of the motion is carried out with a non-linear motion estimating function. The motion parameters reflecting the motion between the second subset of k-space data and the base subset of k-space data are discretizing the subject's motion in 6 parameters for 3D motion (e.g., 3 translational and 3 rotational parameters) until the first sample of the second subset of k-space data. This affects the ideal k-space in a non-linear way, parameterized by the motion parameters.

It is favorable that the computer implemented method takes advantage of the sequential measurement of the k-space in segments of so-called echo trains which are radio frequency signals emitted from excited hydrogen atoms of a subject. More precisely, an echo train is a series of 180° radio frequency refocusing pulses and their corresponding echoes in a fast-spin echo (FSE) pulse sequence used in magnetic resonance imaging.

If, for instance, Cartesian sampling is implemented for sampling the received echo trains, one or multiple corresponding lines of the echo trains are acquired in a considerably short time frame, (e.g., within 200-300 milliseconds), e.g., almost at once. In this regard, it is assumed that the duration of an echo train is short enough such that no motion of the subject/patient arises during this echo train. In other words, it is assumed (e.g., in the first iteration, in case a learning approach is used) that motions would only arise between echo trains, but not in the duration of each echo train. In a limiting case, an echo train may be considered to include a single spin echo.

Thereby, the motion problem is split into one or multiple tasks. After choosing the first subset of k-space data as a base subset of k-space data, which is considered as a motion-free reference, and the ground truth orientation, the second subset of k-space data which may be received after a motion of the subject between the first and second subset of k-space data is aligned to the chosen first subset of k-space data by correcting the second subset of k-space data based on the estimated motion parameters thereof.

It is advantageous that the computer implemented method may utilize the hardware for conventional magnetic resonance imaging without having to deploy additional hardware such as markers or cameras to solve the motion problem. Thus, a simple integration of the computer implemented method into existing methods/systems is possible.

Besides, because the motion problem is overcome by the computer implemented method as far as possible, final images with a significantly improved quality are technically realized. In this case, the total costs for the magnetic resonance imaging are also reduced because subjects participate in less scans than they used to.

In addition, with the non-linear motion estimating function, motion parameters of the second subset of k-space data may be extracted in a considerably short time. The extracted motion parameter may also be used for further processing such as for cardiac imaging and/or diagnoses based on acquisition trajectory.

Furthermore, there are no direct changes on the k-space performed when estimating the motion parameters. If the estimated motion parameters are used for correction (e.g., reducing the motion artifacts by reversing phase shifts and rotations), the k-space is only changed in a known and defined way at the position of the corrupted subsets of k-space data. This contrasts with non-linear approaches which aim at reducing motion induced artifacts in the image; such correction operations do not reflect the original corruption process due to motion.

Moreover, there are only limited consequences in case of a failure of the computer implemented method. In case of a wrong estimation of the motion parameters of the second subset of k-space data, the consequences are either potentially increased amount of motion artifacts (e.g., a reacquisition of the whole sequence may be needed), or potentially longer minimization if a subsequent gradient descent based algorithm is applied. In contrast, image-based approaches using a similar method might induce or remove structures leading to a possible misinterpretation of the final image.

In an embodiment, the method further includes acquiring the non-linear motion estimating function by function approximation, in particular by training an artificial neural network with at least the first and the second subset of k-space data. The algorithm for training the artificial neural network includes similar approaches, where the parameters of a parameterized function are optimized to fulfill the motion estimation task.

If the non-linear motion estimating function is acquired by training an artificial neural network, an initially chosen subset of k-space data (or a group of subsets of k-space data, which have the same orientation) is(are) considered as the ground truth orientation, to which all other subsets of k-space data may be aligned. Another chosen (group of) subset(s) of k-space data is(are) inputted to the artificial neural network to learn how to extract motion parameters between the inputted subset of k-space data (group) and the base subset of k-space data as a motion-free reference assumption (in case of a grouped input, motion parameters for each subset of k-space data). For training, the algorithm applied in the artificial neural network has to minimize a loss function between the ground truth and the output of the artificial neural network, probably with additional constrains for measuring the current performance.

After the training across several subjects, the computer implemented method only applies a learned and parameterized non-linear motion estimating function for estimating motion parameters for every new subject without involving any further optimization algorithms such as gradient descent at interference.

Algorithms applied for the method are not limited to artificial neural network but may be any universal function approximation as a motion is considered as a function parameterized by the motion parameters applied to the "motion-free" first subset of k-space data.

In a further embodiment, the method further includes preprocessing the sampled first and second subset of k-space data to reduce the data dimension by, e.g., combining the receiving coils and/or standardize the data range of the sampled first and the second subset of k-space data. The preprocessing may include a cropping of the input k-space data around its center, which further reduces the computational complexity. The cropped k-space includes at least one line of each subset of k-space data, which is sufficient for motion estimation. The preprocessing may also include feature scaling for easing the algorithmic processing afterwards.

In a further embodiment, the method further includes adding the corrected second subset of k-space data to the base subset of k-space data to extend the (group of) base subset(s) of k-space data.

Basically, the method of motion estimation and the subsequent correction registers the second subset of k-space data, optionally iteratively also for further base subsets of k-space data, with the base subset(s) of k-space data, optionally with one, all or a subset of the previous subsets of k-space data, which minimizes the data consistency error. The motion parameters are estimated for all inputted subsets of k-space data, which are all iteratively processed. The method relies on overlapping data points due to rotation or deviation of the phase between subsets of k-space data.

If in the method the non-linear motion estimating function is acquired by an artificial neural network, it uses a training strategy to adapt its internal parameters to the proposed problem by minimizing the loss function and optional constrains. The input for training is the k-space of the current investigated motion corrupted subsets of k-space data (single or grouped subsets of k-space data) and all previous subsets of k-space data as the base subset of k-space data, possibly with multichannel information from the different receiving coils, in particular after the preprocessing act. Once the training operation results in a reasonable small error, the trained neural network is a non-linear motion estimating function parameterized with the learned parameters and applied to the incoming data (k-space).

In a further embodiment, the method further includes the acts, (e.g., the repeated acts), of receiving and/or sampling a (e.g., another) third subset of k-space data (current subset of k-space data) as radio frequency signals emitted from excited hydrogen atoms of the subject; estimating motion parameters of the third subset of k-space data against the second base subset of k-space data; correcting the third (current) subset of k-space data based on the estimated motion parameters of the third (current) subset of k-space data; and optionally refining the motion parameters of the second (all previous) subset(s) of k-space data in the base subsets of k-space data. Thereby, the motion parameter estimation is gradually improved. An iteration through the k-space with all other k-space subsets may thus be effected.

The motion parameters may be estimated immediately after the acquisition of a subset of k-space data. This allows using the method in a prospective manner because the estimated motion parameters may be directly used for correcting the acquisition of (one or all of) the following subsets of k-space data. Thereby, effects such as spin history changes may be mitigated. In this embodiment, the first sampled subset of k-space data has to form the initial base subset of k-space data and is amended with all following subsets of k-space data, which are processed individually.

In a further embodiment, the method further includes correcting the second base subset of k-space data based on the refined motion parameters of the second subset of k-space data. This may further improve the motion parameter estimation and increasing accuracy of the estimation.

In a further embodiment, the method includes evaluating the second subset of k-space data based on the estimated motion parameters of the second subset of k-space data, in particular also based on the quality of an image generated by the magnetic resonance imaging based on a k-space resulting from the first and second (e.g., base and current) subsets of k-space data, whether after comparing with a predefined threshold value, the correction of the second subset of k-space data is possible or a reacquisition of the second subset of k-space data is to be performed. If the reacquisition of the second subset of k-space data is not needed, then the second subset of k-space data is to be corrected. A reacquired subset of k-space data is considered as new subset of k-space data for the method.

In a further embodiment, the method includes adding the corrected third subset of k-space data to the second base subset(s) of k-space data to form a third (e.g., new) base of subsets of k-space data. The estimation of the motion parameters and correction of the third subset of k-space data may be performed for predefined times or repeatedly until a convergence criterion is met for further improving the consistency of the third base subset of k-space data with the base subsets of k-space data. The sequential registration of each subset of k-space data with the previous ones maximizes data consistency, in particular when using learning approaches.

The first, second, and/or third subsets (and, for example, in the case of a plurality of third subsets, any or, e.g., all of the third subsets) of k-space data may include at least one line and/or one spiral and/or one radial and/or one zig-zag arm in a k-space, respectively.

In a further embodiment, the acts regarding the second and third subset of k-space data are switchable. The order in which subsets of k-space data are corrected may be determined by the acquisition trajectory (e.g. the next subset of k-space data or the same reacquired one). Alternatively, the order may be determined by criteria such as the closeness of the frequencies of a subset of k-space data to the base subset of k-space data. This is possible as the motion parameters are extracted to the base subset of k-space data and not relative to the temporal previously acquired subset of k-space data.

In addition, by altering the order in which the current subset of k-space data is chosen, the effect on the build-up of the base subset of k-space data may be varied, and the result may be improved.

In a further embodiment, the correction of the second and third (e.g., current and non-base) subsets of k-space data is performed at the same time. In particular, the correction of subsets of k-space data received from different receiving coils at different time is performed at the same time. Afterwards, all motion parameters for each subset of k-space data are outputted at once.

In a further embodiment, the correction of the second and/or third (e.g., current and non-base) subset of k-space data includes reversing the motion based on the motion parameters.

Alternatively, the correction involves a forward model for optimizing the motion estimation as initial input with constrains or an additional learning-based algorithm (e.g. additional artificial neural network). This may also include interpolations in order to compensate Nyquist violation for rotational motion.

The disclosure further provides, according to a second aspect, a computer implemented method for magnetic resonance imaging. The method includes providing a k-space including raw data corresponding to radio frequency signals emitted from excited hydrogen atoms of a subject; receiving at least a first subset of k-space data (or a group of subsets of k-space data or all subsets of k-space data) as radio frequency signals emitted from excited hydrogen atoms of the subject; sampling the first subset of k-space data; choosing the k-space as a base subset of k-space data; estimating motion parameters of the first subset of k-space data against the base subset of k-space data; and correcting the first subset of k-space data based on the estimated motion parameters of the first subset of k-space data. The motion parameters of the first subset of k-space data are parameters of a non-linear function representing a motion of the subject between receiving the first subset of k-space data and generating the reference k-space as the base subset of k-space data.

If a learning-based algorithm is used to acquiring the non-linear function, the algorithm learns how to extract motion parameters between the current subset of k-space data and the k-space as a motion-free reference assumption. Within each iteration through the subsets of k-space data and global iterations, the k-space may be refined using the motion parameters and/or a model-based motion correction algorithm.

In this second aspect, the motion-free reference k-space may be estimated from corrupted k-space data or a corrupted image based on another artificial neural network or obtained from a separate reference scan. The estimated motion free k-space may be in image space and furthermore only has to incorporate complex k-space values used in the estimating algorithm (for example, only cropped).

The further provides, according to a third aspect, a system for magnetic resonance imaging including at least a receiving coil configured to receive subsets of k-space data as radio frequency signals emitted from excited hydrogen atoms of a subject; a sampling unit configured to sample the received subsets of k-space data; a choosing unit configured to choose a base subset of k-space data from one of the sampled subsets of k-space data or a k-space including raw data corresponding to radio frequency signals emitted from excited hydrogen atoms of the subject; an estimation unit configured to estimate motion parameters of the other sampled subsets of k-space data or all of the sampled subsets of k-space data against the base subset of k-space data; and a correcting unit configured to correcting the other sampled subsets of k-space data or all of the sampled subsets of k-space data based on the estimated motion parameters of the other sampled subsets of k-space data or all of the sampled subsets of k-space data. The motion parameters of the other sampled subsets of k-space data or all of the sampled subsets of k-space data are parameters of a non-linear function representing a motion of the subject between receiving the chosen subset of k-space data or the k-space and receiving the other subsets of k-space data or all of the subsets of k-space data.

The further provides, according to a fourth aspect, a computer program including instructions which, when the program is executed by a computer, cause the computer to carry out the method according to the first or second aspect.

The further provides, according to a fifth aspect, a computer-readable medium including instructions which, when executed by a computer, cause the computer to carry out the method according to the first or second aspect.

BRIEF DESCRIPTION OF THE DRAWINGS

Further advantageous details and features may be taken from the following description of several exemplary embodiments of in conjunction with the drawings, in which.

DETAILED DESCRIPTION

Figure 1:
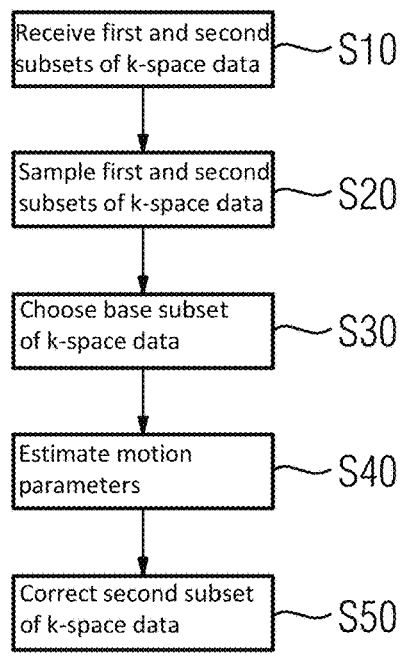
FIG. 1 depicts a block diagram of an embodiment of the computer implemented method for magnetic resonance imaging.

The embodiment of the computer implemented method for magnetic resonance imaging shown in FIG. 1 includes five acts S10, S20, S30, S40, S50.

In act S10, at least a first and a second subset of k-space data as radio frequency signals emitted from excited hydrogen atoms of a subject are received. In act S20, the first and second subset of k-space data are sampled. In act S30, the first subset of k-space data is chosen as a base subset of k-space data. In act S40, motion parameters of the second subset of k-space data against the base subset of k-space data are estimated. In act S50, the second subset of k-space data is corrected based on the estimated motion parameters of the second subset of k-space data. The motion parameters of the second subset of k-space data are parameters of a non-linear function representing a motion of the subject between receiving the first subset of k-space data and receiving the second subset of k-space data.

Figure 2:
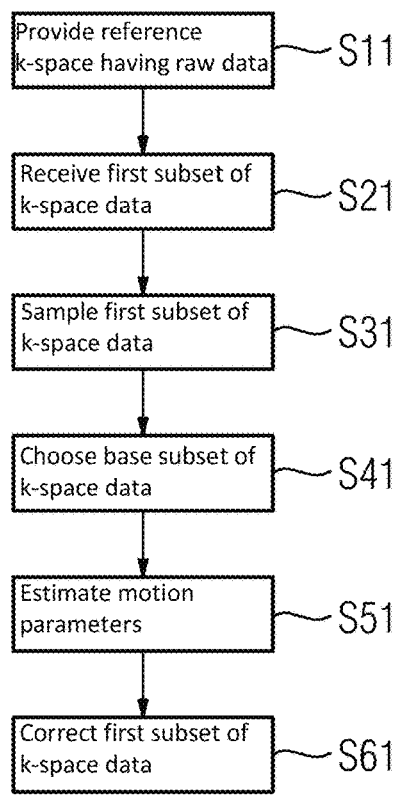
FIG. 2 depicts a block diagram of another embodiment of the computer implemented method for magnetic resonance imaging.

The embodiment of the computer implemented method for magnetic resonance imaging shown in FIG. 2 includes six acts S11, S21, S31, S41, S51, S61.

In act S11, a reference k-space including raw data corresponding to radio frequency signals emitted from excited hydrogen atoms of a subject is provided. In act S21, at least a first subset of k-space data as radio frequency signals emitted from excited hydrogen atoms of the subject is received. In act S31, the first subset of k-space data is sampled. In act S41, the reference k-space is chosen as a base subset of k-space data. In act S51, motion parameters of the first subset of k-space data against the base subset of k-space data are estimated. In act S61, the first subset of k-space data is corrected based on the estimated motion parameters of the first subset of k-space data. The motion parameters of the first subset of k-space data are parameters of a non-linear function representing a motion of the subject between receiving the first subset of k-space data and the reference k-space orientation.

Figure 3:
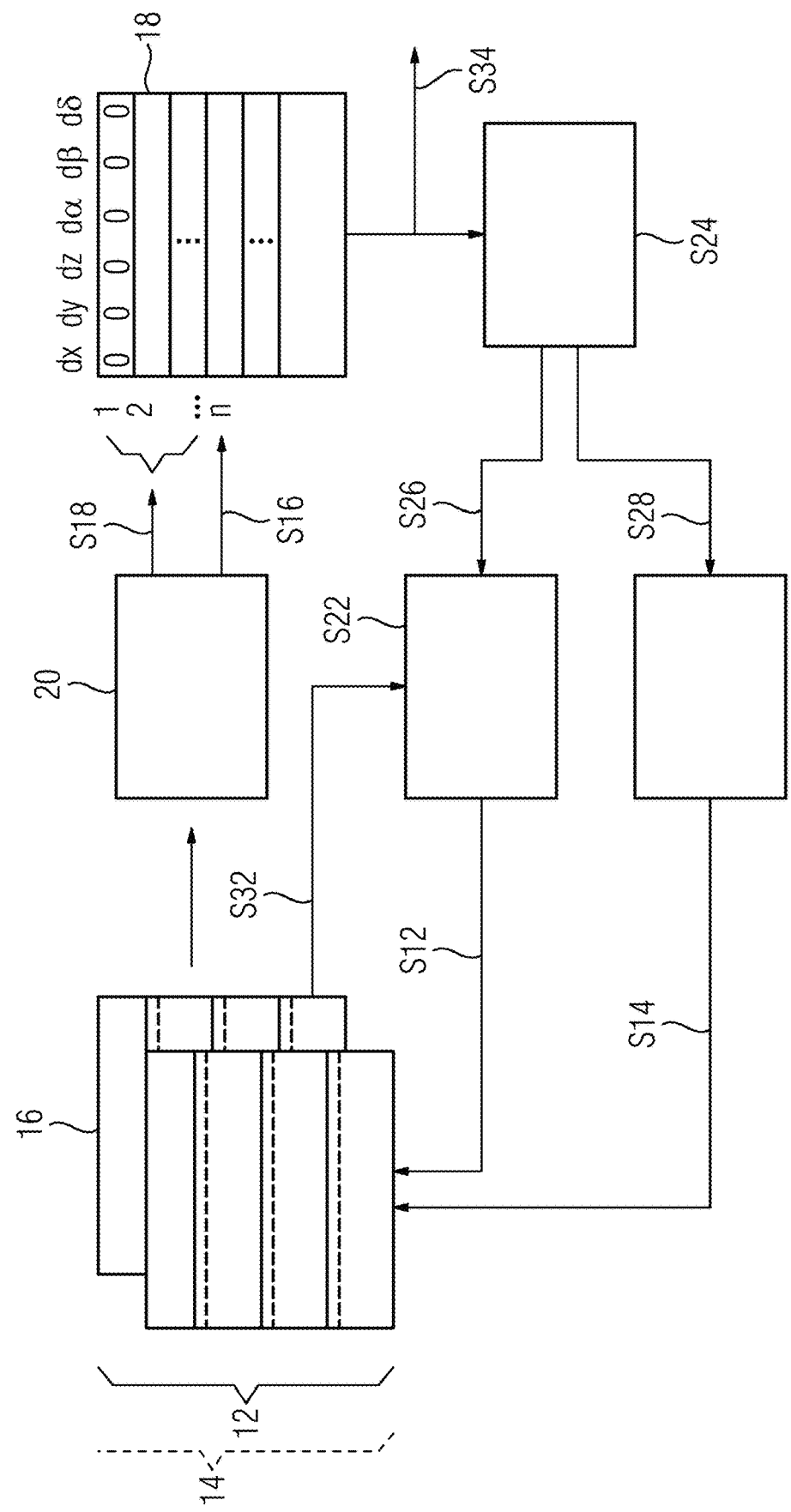
FIG. 3 depicts schematically a flow diagram of another embodiment of the computer implemented method for magnetic resonance imaging.

The flow diagram of another embodiment of the computer implemented method for magnetic resonance imaging shown in FIG. 3 represents a processing pipeline for estimating and correcting motion in magnetic resonance imaging scans based on raw k-space data.

In this embodiment, echo trains are provided as subsets of k-space data. The solid lines 12 represent reference lines from previous echo trains, and the broken lines 14 represent lines from the current/new sampled complex valued echo train. It is noted that on the input side 16, although received raw data from two channels corresponding to two receiving coils are shown, the channel number in this embodiment is not limited to two.

As shown in FIG. 3, the incoming raw data include a current echo train 14 combined with all previous echo trains 12 referred to as base echo trains in the k-space which incorporate at least the initially chosen echo train. The base echo trains may be extended by the already corrected (S12) or the reacquired (S14) echo trains. The algorithm 20 extracts 3D rigid motion parameters of the current echo train 14 in dx, dy, dz direction for translation and dα, dβ, dδ for rotation (see the output side 18 and step S16). Those parameters represent a motion between the current echo train 14 and the base echo trains 12. On the output side 18, the data in row 1 (six "0") belong to the initially chosen echo train, which is assumed as motion-free.

Afterwards, the current echo train 14 is evaluated based on its impact on the image, and the estimated motion parameters are evaluated (S24), whether a correction of the current echo train 14 is possible (S26) or a reacquisition of the current echo train 14 should be preferred (S28). If reacquisition is not implemented, the current echo train 14 is corrected (S22).

In an embodiment now shown, the base echo trains 12 are replaced with an optimal motion-free k-space estimation using a different algorithm. In this embodiment, all acquired echo trains, including the one considered as motion-free, are registered against the motion-free k-space estimation. In this regard, the motion-free k-space is also used as input to the related algorithm. Within each (optional) iteration, the acquired k-space may be refined using the motion parameters in a model-based motion correction algorithm.

The parameters on the output side 18 shown in FIG. 3 are used to adapt the current echo train 14 relative to the base echo trains 12 (S22) and to add the corrected current echo train 14 or the replaced echo train from a reacquisition to the base echo trains 12 (S12, S14). This step refines the base echo trains 12 with more information, increasing accuracy of the motion parameter estimation. The algorithm 20 allows refining (S18) previous estimations of the motion parameters, which are then used to also correct echo trains in the base (S32). This may gradually improve the motion estimation.

The search/estimation for motion parameters may be repeated several times in order to improve the consistency in the set of the base echo trains 12. The order in which the echo trains are processed may be altered randomly or as predefined in order to vary the effect on the build-up of the base echo trains 12.

The correction of the echo train 14 (S22) may be done by reversing the motion using the extracted parameters, using a forward model with optional constrains or using an additional learning-based algorithms, accelerated by the extracted motion parameters. This may also include interpolations to compensate Nyquist violation for rotational motion.

For all motion-corrected echo trains, the motion during the acquisition of such an echo train may be corrected by the registration of each line with the remaining lines of the echo train using the same method. Furthermore, all lines may be processed individually from the beginning.

After all motion parameters between the echo trains 12, 14 were estimated, a separate motion correction may be performed and the k-space may be transferred to a reconstruction algorithm or for further motion correction.

The extracted motion parameters may be used in further processing such as diagnoses, adapting the coil sensitivity calculation and/or mitigating spin history effects (S34).

The motion parameters may be calculated immediately after the acquisition of an echo train and directly used for correcting the acquisition of (one or all of) the following echo trains. Thereby, effects such as spin history changes may be mitigated.

More than one echo train 14 may be corrected at the same time.

Figure 4:
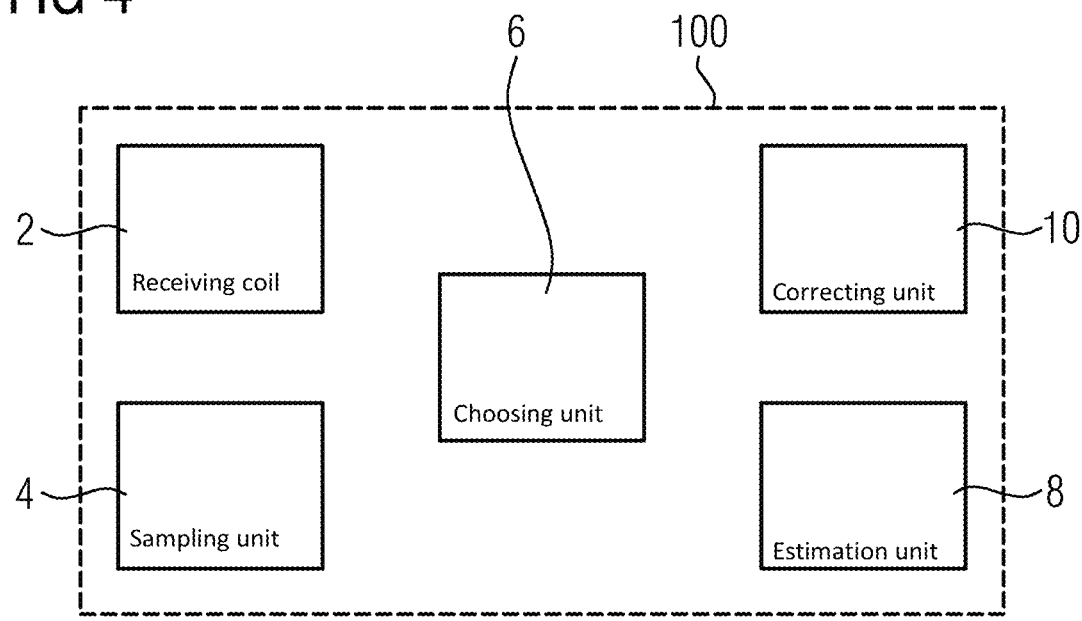
FIG. 4 depicts a block diagram of an embodiment of the system for magnetic resonance imaging.

The embodiment of the system 100 for magnetic resonance imaging shown in FIG. 4 includes at least a receiving coil 2 configured to receive subsets of k-space data as radio frequency signals emitted from excited hydrogen atoms of a subject, a sampling unit 4 configured to sample the received subsets of k-space data, a choosing unit 6 configured to choose a base subset of k-space data from one of the sampled subsets of k-space data or a k-space including raw data corresponding to radio frequency signals emitted from excited hydrogen atoms of the subject, an estimation unit 8 configured to estimate motion parameters of the other sampled subsets of k-space data or all of the sampled subsets of k-space data against the base subset of k-space data, and a correcting unit 10 configured to correcting the other sampled subsets of k-space data or all of the sampled subsets of k-space data based on the estimated motion parameters of the other sampled subsets of k-space data or all of the sampled subsets of k-space data. The motion parameters of the other sampled subsets of k-space data or all of the sampled subsets of k-space data are parameters of a non-linear function representing a motion of the subject between receiving the chosen subset of k-space data or the k-space and receiving the other subsets of k-space data or all of the subsets of k-space data.

Figure 5:
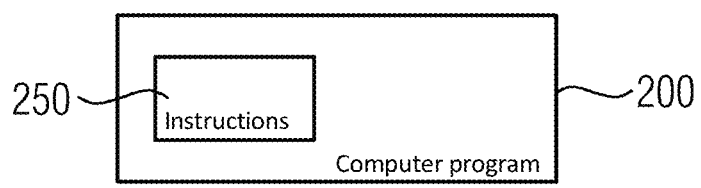
FIG. 5 depicts a block diagram of an embodiment of the computer program.

The embodiment of the computer program 200 shown in FIG. 5 includes instructions 250 which, when the program 200 is executed by a computer, cause the computer to carry out the embodiment of the method shown in FIG. 1, 2, or 3.

Figure 6:
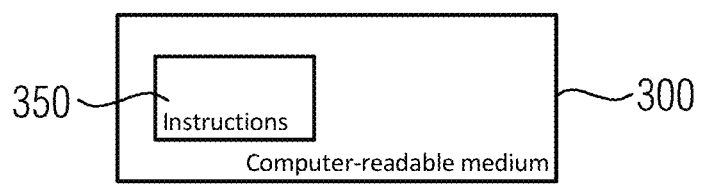
FIG. 6 depicts a block diagram of an embodiment of the computer-readable medium.

The embodiment of the computer-readable medium 300 shown in FIG. 6 includes instructions 350 which, when executed by a computer, cause the computer to carry out the embodiment of the method shown in FIG. 1, 2, or 3.

The base/initial subsets of k-space data, the current/second subsets of k-space data refers to subsets of k-space data which do not have to align with the acquisition and may include several subsets of k-space data combined. In case of a subset of k-space data for which the motion parameters are to be estimated, it may also include all acquired subsets of k-space data. The number of outputted parameter may increase by the increasing number of subsets of k-space data at the input. All subsets of k-space data except for the base subsets of k-space data are processed at least once.

The disclosure is described and illustrated in detail by the embodiments mentioned above. However, the disclosure is not limited by the disclosed examples, and other variations may be derived therefrom while still being inside the protection scope of the disclosure. For instance, although it is described above that Cartesian sampling is applied, other sampling trajectories such as radial sampling may also be used. The concept of echo train may be generalized to contain one or more parts of k-space; the method is independent of the usage of spin echoes and applies to gradient echoes as well, or to a mixture between spin echoes and gradient echoes.

Although the disclosure has been illustrated and described in greater detail by the exemplary embodiments, the disclosure is not restricted by these exemplary embodiments. Other variations may be derived herefrom by the person skilled in the art, without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A computer implemented method for magnetic resonance imaging, the method comprising:
receiving a first subset of k-space data and a second subset of k-space data as radio frequency signals emitted from excited hydrogen atoms of a subject;
sampling the first subset of k-space data and the second subset of k-space data;
choosing the sampled first subset of k-space data as a base subset of k-space data;
estimating motion parameters of the second subset of k-space data against the base subset of k-space data;
acquiring a non-linear motion estimating function by function approximation by training a neural network; and
correcting the second subset of k-space data based on the motion parameters of the second subset of k-space data, wherein the motion parameters of the second subset of k-space data are parameters of the non-linear motion estimating function representing a motion of the subject between receiving the first subset of k-space data and receiving the second subset of k-space data.

2. The method of claim 1, wherein the acquiring of the non-linear motion estimating function is performed by training an artificial neural network with at least the first subset of k-space data and the second subset of k-space data.

3. A computer implemented method for magnetic resonance imaging, the method comprising:
receiving a first subset of k-space data and a second subset of k-space data as radio frequency signals emitted from excited hydrogen atoms of a subject;
sampling the first subset of k-space data and the second subset of k-space data;
preprocessing the sampled first subset of k-space data and the second subset of k-space data to reduce a data dimension and/or standardize a data range of the sampled first subset of k-space data and the second subset of k-space data;

choosing the sampled first subset of k-space data as a base subset of k-space data;

estimating motion parameters of the second subset of k-space data against the base subset of k-space data; and correcting the second subset of k-space data based on the motion parameters of the second subset of k-space data, wherein the motion parameters of the second subset of k-space data are parameters of a non-linear motion estimating function representing a motion of the subject between receiving the first subset of k-space data and receiving the second subset of k-space data.

4. A computer implemented method for magnetic resonance imaging, the method comprising:

receiving a first subset of k-space data and a second subset of k-space data as radio frequency signals emitted from excited hydrogen atoms of a subject;

sampling the first subset of k-space data and the second subset of k-space data;

choosing the sampled first subset of k-space data as a base subset of k-space data;

estimating motion parameters of the second subset of k-space data against the base subset of k-space data;

correcting the second subset of k-space data based on the motion parameters of the second subset of k-space data, wherein the motion parameters of the second subset of k-space data are parameters of a non-linear motion estimating function representing a motion of the subject between receiving the first subset of k-space data and receiving the second subset of k-space data; and adding the corrected second subset of k-space data to the base subset of k-space data to form a second base subset of k-space data.

5. The method of claim 4, further comprising:

receiving and/or sampling a third subset of k-space data as radio frequency signals emitted from excited hydrogen atoms of the subject;

estimating motion parameters of the third subset of k-space data against the second base subset of k-space data;

correcting the third subset of k-space data based on the estimated motion parameters of the third subset of k-space data; and refining the motion parameters of the second subset of k-space data.

6. The method of claim 5, further comprising:

correcting the second base subset of k-space data based on the refined motion parameters of the second subset of k-space data.

7. The method of claim 5, further comprising:

adding the corrected third subset of k-space data to the second base subset of k-space data to form a third base subset of k-space data, wherein the estimating of the motion parameters of the third subset of k-space data is performed for predefined times or repeatedly until a convergence criterion is met for improving a consistency of the corrected third subset of k-space data with the third base subset of k-space data.

8. The method of claim 5, wherein one or more of the first subset of k-space data, the second subset of k-space data, and the third subset of k-space data comprise a line in a k-space, a spiral in the k-space, a radial in the k-space, a zig-zag arm in the k-space, or a combination thereof.

9. The method of claim 5, wherein the correcting of the second subset of k-space data and the correcting of the third subset of k-space data is performed at a same time.

10. The method of claim 5, wherein the correcting of the second subset of k-space data and/or the correcting of the third subset of k-space data comprises reversing the motion based on the motion parameters.

11. A computer implemented method for magnetic resonance imaging, the method comprising:

receiving a first subset of k-space data and a second subset of k-space data as radio frequency signals emitted from excited hydrogen atoms of a subject;

sampling the first subset of k-space data and the second subset of k-space data;

choosing the sampled first subset of k-space data as a base subset of k-space data;

estimating motion parameters of the second subset of k-space data against the base subset of k-space data;

evaluating the second subset of k-space data based on the estimated motion parameters of the second subset of k-space data and comparing the second subset of k-space data with a predefined threshold value; and correcting the second subset of k-space data based on the motion parameters of the second subset of k-space data, wherein the motion parameters of the second subset of k-space data are parameters of a non-linear motion estimating function representing a motion of the subject between receiving the first subset of k-space data and receiving the second subset of k-space data; or reacquiring the second subset of k-space data.

12. The method of claim 11, wherein the evaluating of the second subset of k-space data is also based on a quality of an image generated by the magnetic resonance imaging based on a k-space resulting from the first subset of k-space data and the second subset of k-space data.

13. A computer implemented method for magnetic resonance imaging, the method comprising:

providing a k-space comprising raw data corresponding to radio frequency signals emitted from excited hydrogen atoms of a subject;

receiving at least a first subset of k-space data as radio frequency signals emitted from excited hydrogen atoms of the subject;

sampling the first subset of k-space data;

choosing the k-space comprising the raw data as a base subset of k-space data;

estimating motion parameters of the first subset of k-space data against the base subset of k-space data;

acquiring a non-linear motion estimating function by function approximation by training a neural network; and correcting the first subset of k-space data based on the motion parameters of the first subset of k-space data, wherein the motion parameters of the first subset of k-space data are parameters of the non-linear motion estimating function representing a motion of the subject between receiving the first subset of k-space data and the k-space.

14. The method of claim 13, wherein the acquiring of the non-linear motion estimating function is performed by training an artificial neural network with at least the first subset of k-space data.

15. A system for magnetic resonance imaging, the system comprising:

at least a receiving coil configured to receive subsets of k-space data as radio frequency signals emitted from excited hydrogen atoms of a subject;

a sampling unit configured to sample the received subsets of k-space data;

a choosing unit configured to choose a base subset of k-space data from one of the sampled subsets of k-space data or a k-space comprising raw data corresponding to radio frequency signals emitted from excited hydrogen atoms of the subject;

an estimation unit configured to estimate motion parameters of the other sampled subsets of k-space data or all of the sampled subsets of k-space data against the base subset of k-space data; and a correcting unit configured to correct the other sampled subsets of k-space data or all of the sampled subsets of k-space data based on the motion parameters of the other sampled subsets of k-space data or all of the sampled subsets of k-space data, wherein the motion parameters of the other sampled subsets of k-space data or all of the sampled subsets of k-space data are parameters of a non-linear motion estimating function representing a motion of the subject between receiving the chosen base subset of k-space data or the k-space comprising the raw data and receiving the other subsets of k-space data or all of the subsets of k-space data, and wherein the system is configured to acquire the non-linear motion estimating function by function approximation by training a neural network.

16. The system of claim 15, wherein the acquisition of the non-linear motion estimating function is configured to be performed by training an artificial neural network with the received subsets of k-space data.

17. A non-transitory computer-readable medium comprising instructions which, when executed by a computer, cause the computer to:

receive a first subset of k-space and a second subset of k-space data as radio frequency signals emitted from excited hydrogen atoms of a subject;

sample the first subset of k-space data and the second subset of k-space data;

choose the sampled first subset of k-space data as a base subset of k-space data;

estimate motion parameters of the second subset of k-space data against the base subset of k-space data;

acquire a non-linear motion estimating function by function approximation by training a neural network; and correct the second subset of k-space data based on the motion parameters of the second subset of k-space data, wherein the motion parameters of the second subset of k-space data are parameters of the non-linear motion estimating function representing a motion of the subject between receiving the first subset of k-space data and receiving the second subset of k-space data.

18. The non-transitory computer-readable medium of claim 17, wherein the acquisition of the non-linear motion estimating function is configured to be performed by training an artificial neural network with at least the first subset of k-space data and the second subset of k-space data.

* * * * *